United States Patent
Foster et al.

(10) Patent No.: US 7,830,003 B2
(45) Date of Patent: Nov. 9, 2010

(54) MECHANICAL ISOLATION FOR MEMS DEVICES

(75) Inventors: Michael Foster, Issaquah, WA (US); Ijaz Jafri, Woodinville, WA (US); Mark Eskridge, Renton, WA (US); Shifang Zhou, Redmond, WA (US)

(73) Assignee: Honeywell International, Inc., Morristown, NJ (US)

( * ) Notice: Subject to any disclaimer, the term of this patent is extended or adjusted under 35 U.S.C. 154(b) by 174 days.

(21) Appl. No.: 11/965,623

(22) Filed: Dec. 27, 2007

(65) Prior Publication Data
US 2009/0166827 A1    Jul. 2, 2009

(51) Int. Cl.
*H01L 23/34* (2006.01)
(52) U.S. Cl. ........................ 257/724; 257/723
(58) Field of Classification Search .......... 257/723, 257/724, 414, 415, 704
See application file for complete search history.

(56) References Cited

U.S. PATENT DOCUMENTS

| | | | |
|---|---|---|---|
| 6,768,196 B2 | 7/2004 | Harney et al. | |
| 6,946,742 B2 | 9/2005 | Karpman | |
| 7,166,911 B2 | 1/2007 | Karpman et al. | |
| 2004/0041254 A1* | 3/2004 | Long et al. | 257/703 |
| 2005/0189635 A1* | 9/2005 | Humpston et al. | 257/678 |
| 2007/0170525 A1* | 7/2007 | Eskridge | 257/404 |
| 2009/0282915 A1* | 11/2009 | Ohta et al. | 73/504.12 |

* cited by examiner

*Primary Examiner*—S. V Clark
(74) *Attorney, Agent, or Firm*—P. G. Scott Born; Black Lowe & Graham PLLC

(57) ABSTRACT

A device according to the present invention includes a MEMS device supported on a first side of a die. A first side of an isolator is attached to the first side of the die. A package is attached to the first side of the isolator, with at least one electrically conductive attachment device attaching the die to the isolator and attaching the isolator to the package. The isolator may include isolation structures and a receptacle.

4 Claims, 10 Drawing Sheets

MECHANICAL ISOLATION FOR MEMS DEVICES

Microelectromechanical systems (MEMS) devices or computer chips are often mounted on dies. Non-inertial and mechanical stresses due to die mounting can affect the performance of MEMS devices. Additionally, the devices are subject to stress during wire bonding. Packaging stress causes problems for capacitive sensors that require stable geometry for stable output. Making wire bonds at the package level also increases the cost of manufacture because each part must be handled separately, and increases the chance of damage to the assembly.

MEMS devices are often mounted to another structure in order to measure inertial forces experienced by the structure. Directly mounted MEMS devices are exposed to stresses applied by the structure, which leads the MEMS device to produce inaccurate measurements.

SUMMARY OF THE INVENTION

A device and method for isolation of MEMS devices is provided by an embodiment of the present invention. A device according to one aspect of the present invention includes a MEMS device supported on a first side of a die. A first side of an isolator is attached to the first side of the die. A package is attached to the first side of the isolator, with at least one electrically conductive attachment device attaching the die to the isolator and attaching the isolator to the package.

Embodiments of the isolator include isolation tines through a perimeter of the isolator. In other embodiments, the die is attached to a portion of the isolator medial to the isolation tines, while the package is attached to a portion of the isolator lateral to the isolation tines.

Further embodiments include a top cover plate attached to the die, and a corresponding receptacle in the isolator to receive the top cover plate. Other aspects include an angled shelf on a second side of the isolator.

A method according to the present invention includes attaching a MEMS device to a first side of a die, attaching a first side of an isolator to the first side of the die, attaching a package to the first side of the isolator, and using at least one electrically conductive attachment device to attach the die to the isolator and to attach the isolator to the package.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
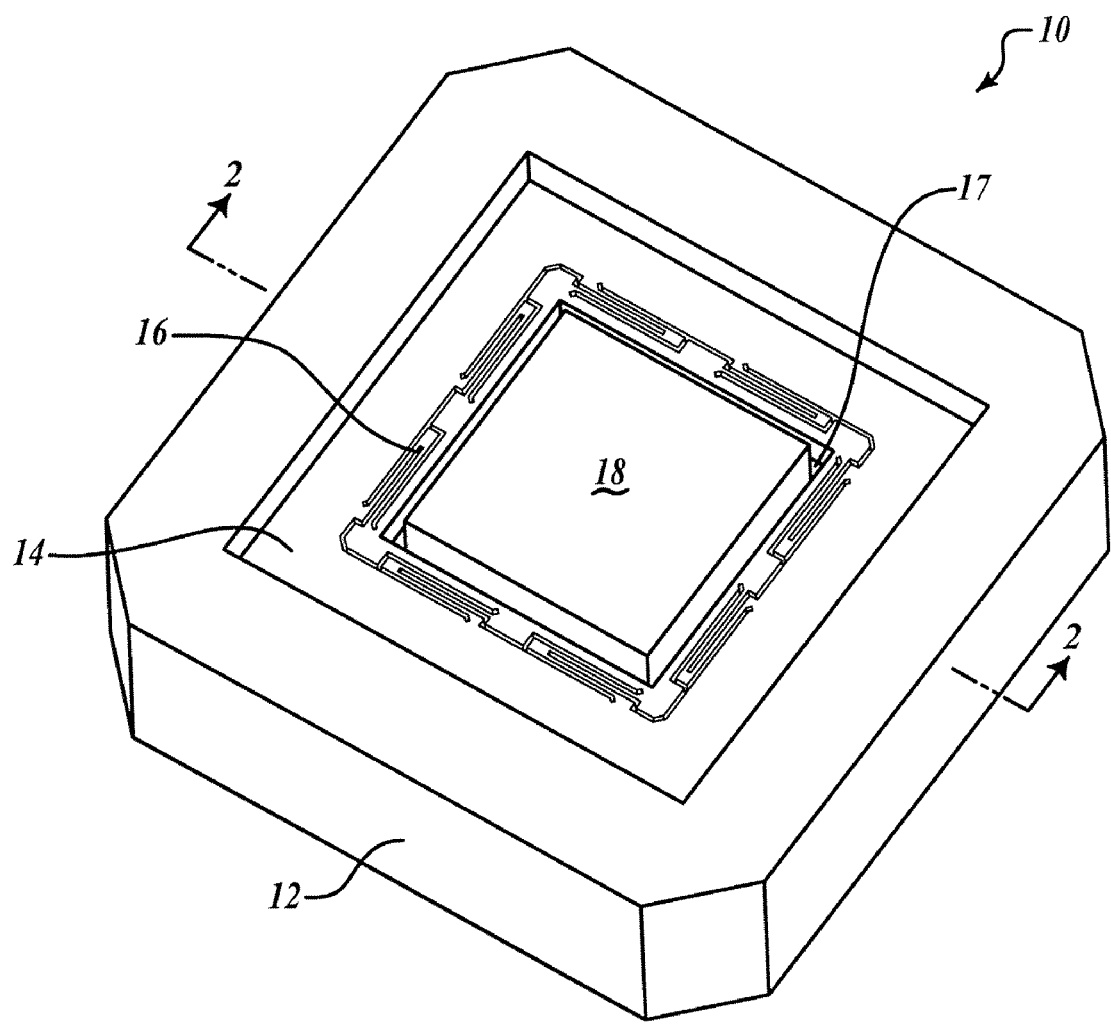
FIG. 1 is a top perspective view of a device according to an embodiment of the present invention.

FIG. 1 shows a device 10 according to an embodiment of the present invention. The device 10 includes a package 12 and an isolator 14. The isolator 14 includes perimeter isolation structures 16, which can be tines, and a receptacle 17 for receiving a top cover 18 of an associated MEMS device (not shown). The isolator may be fabricated from a non-conductive, semi-conductive or fully conductive material.

Figure 2:
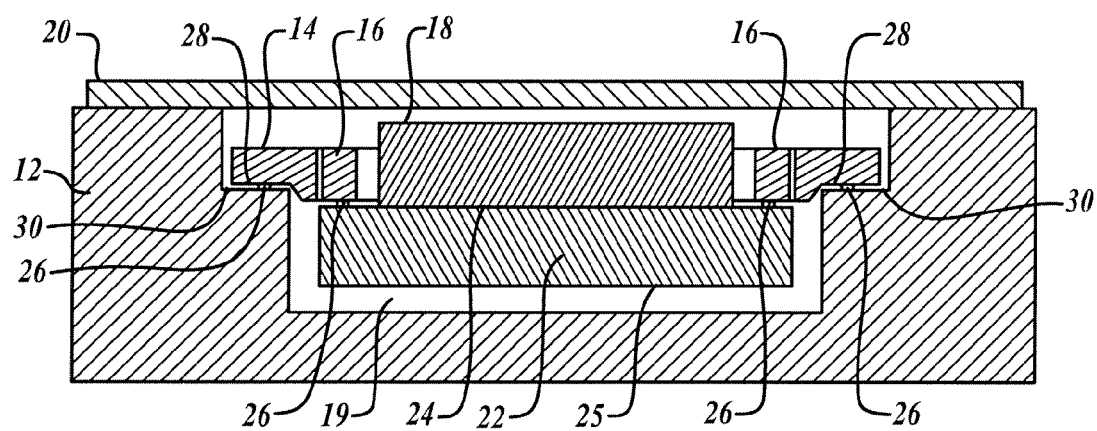
FIG. 2 is a cross-section of the device of FIG. 1 along AA.

FIG. 2 is a cross-section through AA of the device 10 of FIG. 1. A package cover 20 can be included as advantageous depending on the MEMS device and the intended working environment. A die 22 is suitably attached to a MEMS device (not shown) on a top side 24 of the die 22. The top side 24 of the die 22 is attached by an electrically conductive attachment device 26, such as gold bumps, to a bottom side 28 of the isolator 14. The package includes a stepped recess 19 for receiving the MEMS device, die 22, and isolator 14, with the bottom side 28 of the isolator 14 attached by electrically conductive attachment devices 26 to a wirebond shelf 30 of the package 12. Electrically conductive traces (not shown) on the bottom side 28 of the isolator 14 connect the devices 26 attaching the die 22 to the isolator 14 with the devices 26 attaching the isolator 14 to the package 12. Electrically conductive traces (not shown) on the package 12 connect the devices 26 attaching the isolator 14 to the package 12 to electrically conductive leads (not shown) on the outside of the package 12. If the isolator 14 is fabricated from a semiconductive or fully conductive material, the traces must be electrically isolated from the isolator 14.

Figure 3:
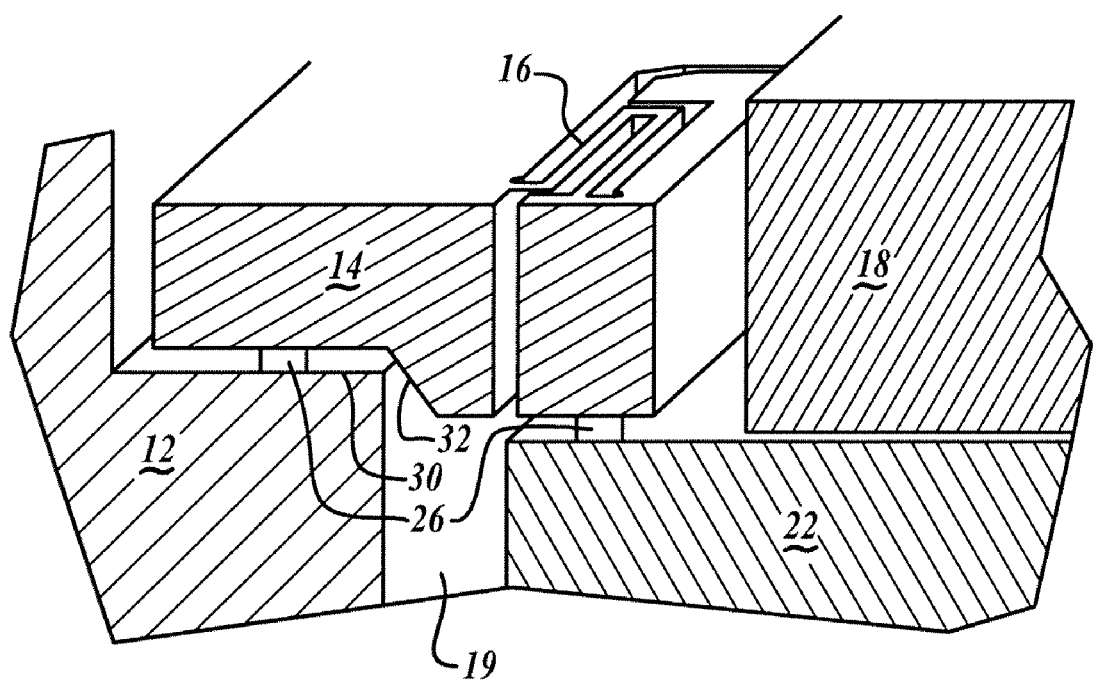
FIG. 3 is a partial cross-section of a portion of the device of FIG. 1.

FIG. 3 is a partial cross-section of a portion of the device of FIG. 1. The isolator 14 can include an angled shelf 32. When the isolator 14 is attached to the package 12, the angled shelf 32 is in contact with the package 12. The shelf 32 thus allows variation of the vertical location of the die 22 with respect to the package 12. Also, the attachment devices 26 attaching the isolator 14 to the package 12 are located on a lateral (to the structures 16) portion of the isolator 14, while the devices 26 attaching the die 22 to the isolator 14 are located on a medial portion of the isolator 14. Thus, the isolation structures 16 serve to reduce the amount of stress conveyed to the die 22 from the package 12.

Figure 4A:
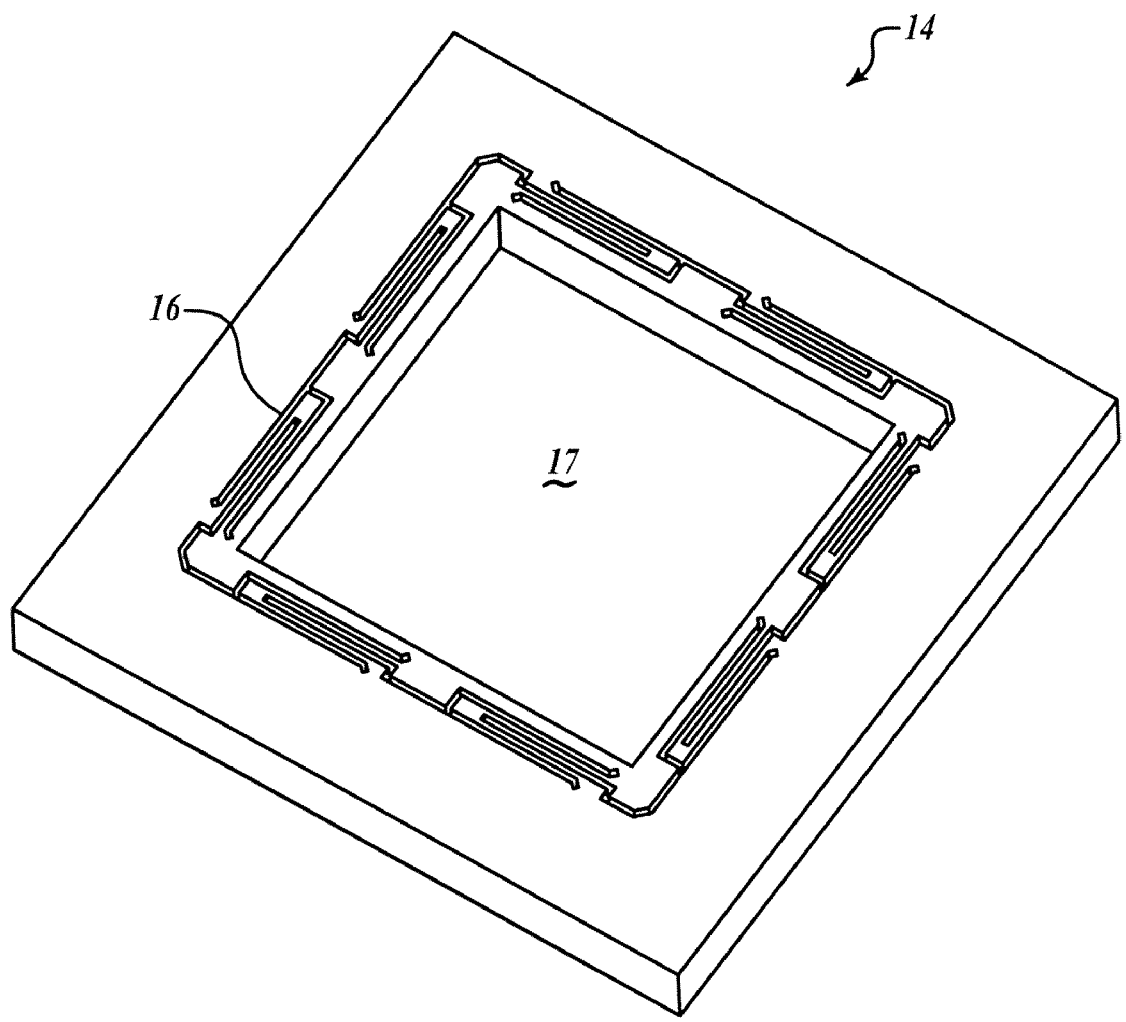
FIG. 4A is a top perspective view of an isolator according to an embodiment of the present invention.
Figure 4B:
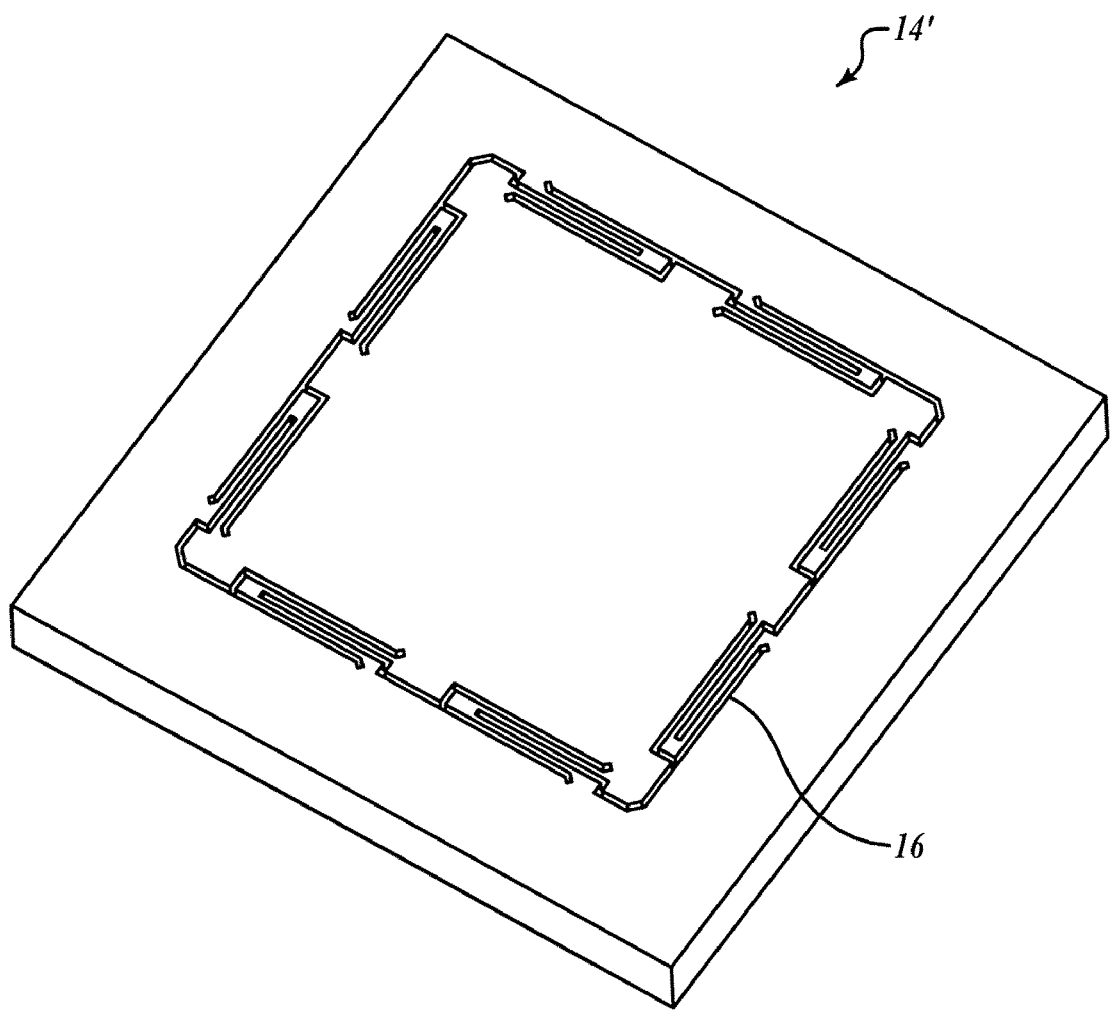
FIG. 4B is an isolator according to an alternate embodiment of the present invention.
Figure 5A:
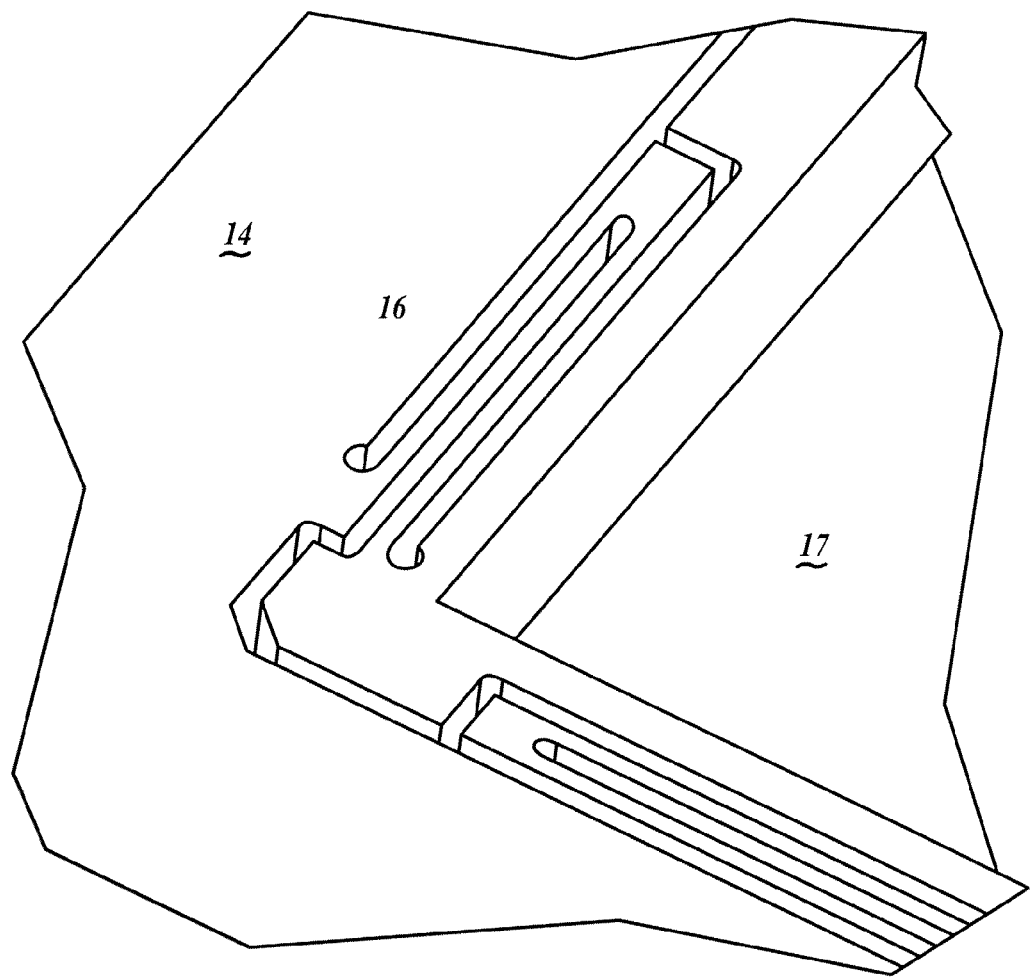
FIG. 5A is a partial top perspective view of the isolator of FIG. 4.
Figure 5B:
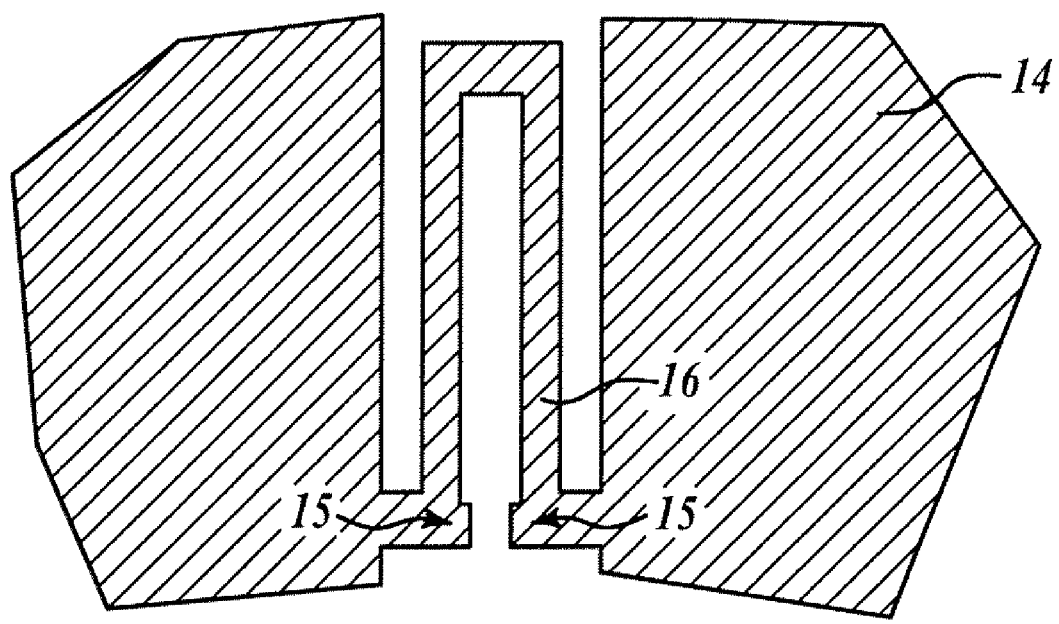
FIG. 5B partially illustrates an alternate embodiment of the isolator of FIG. 4.

FIG. 4A is a top perspective view of the isolator 14. The isolator 14 includes the receptacle 17 and perimeter isolation tines 16. FIG. 4B illustrates an isolator 14' according to an embodiment of the present invention. The isolator 14' is used when the MEMS device and intended operating environment do not require a top cover 18, and thus does not have a receptacle 17. FIG. 5A is a partial top perspective view of the isolator of FIG. 4. The tines 16 can have a variety of flexural shapes. The tines 16 may have a single fold, more than one fold, or no folds. The tines 16 may be nested if desired, and may go around corners. The tines 16 may be formed by KOH etching, EDP, or TMAH. FIG. 5B illustrates an alternate embodiment of the tines 16 that includes shock stops 15 to limit the amount of displacement allowed by the tines 16.

Figure 6A:
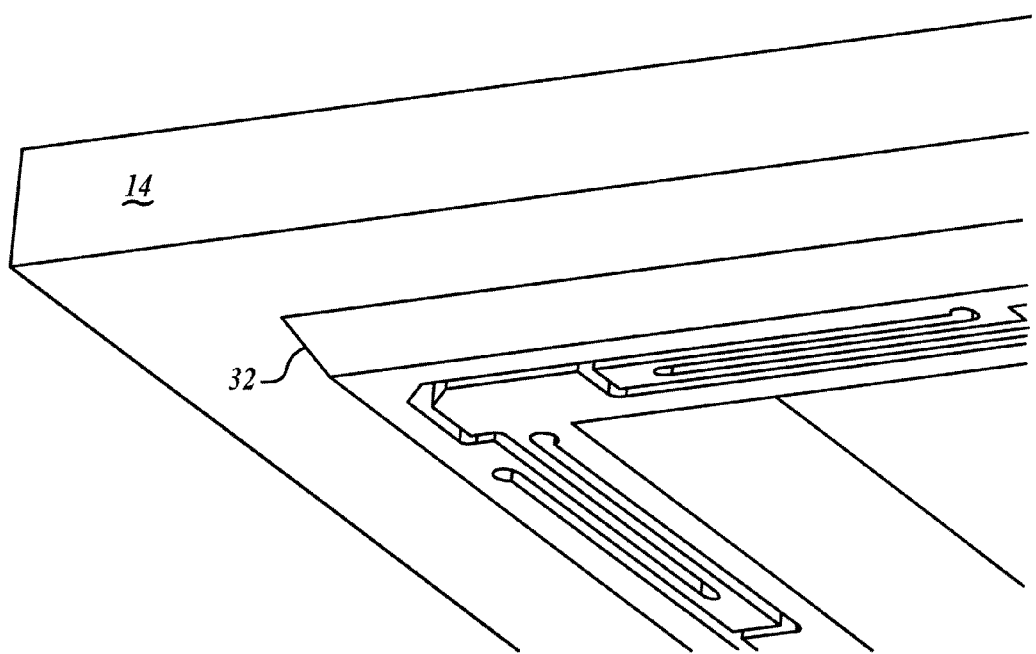
FIG. 6A is a bottom perspective view of the isolator of FIG. 4.
Figure 6B:
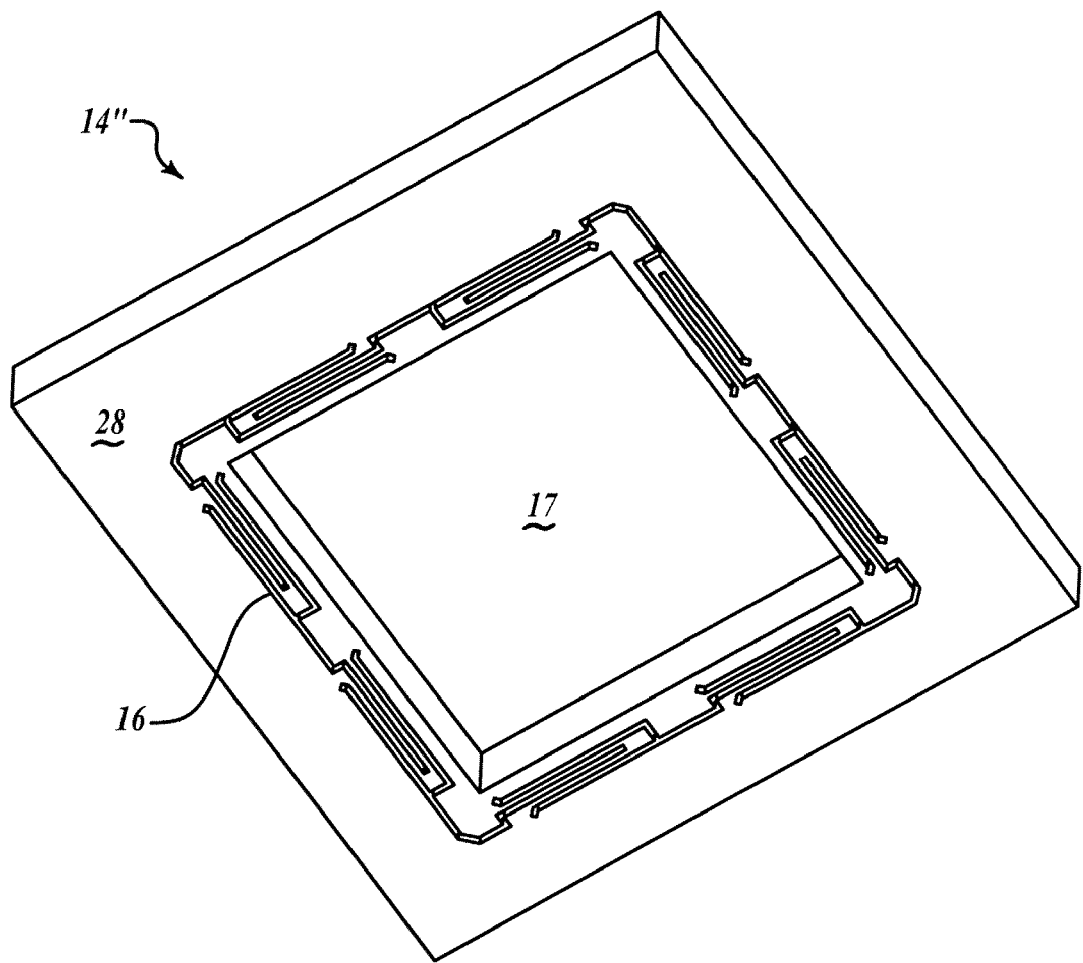
FIG. 6B is an isolator according to an alternate embodiment of the present invention.

FIG. 6A is a partial bottom perspective view of the isolator 14 of FIG. 2. The isolator 14 includes the angled shelf 32 extending from the bottom side 28 of the isolator 14. As can be appreciated from FIG. 2, the size, location, and angle of the shelf 32 may be varied to vary a vertical location of the die 22 with respect to the package 12. The shelf 32 can be used to raise the die 22 with respect to the package 12 when the vertical height of the die 22 and/or the vertical depth of the recess 19 require additional clearance between the bottom side 25 (FIG. 2) of the die 22 and the recess 19. In cases where the vertical height of the die 22 does not require a shelf 32, the embodiment of the isolator 14", shown in FIG. 6B, without a shelf 32, can be used.

Figure 7:
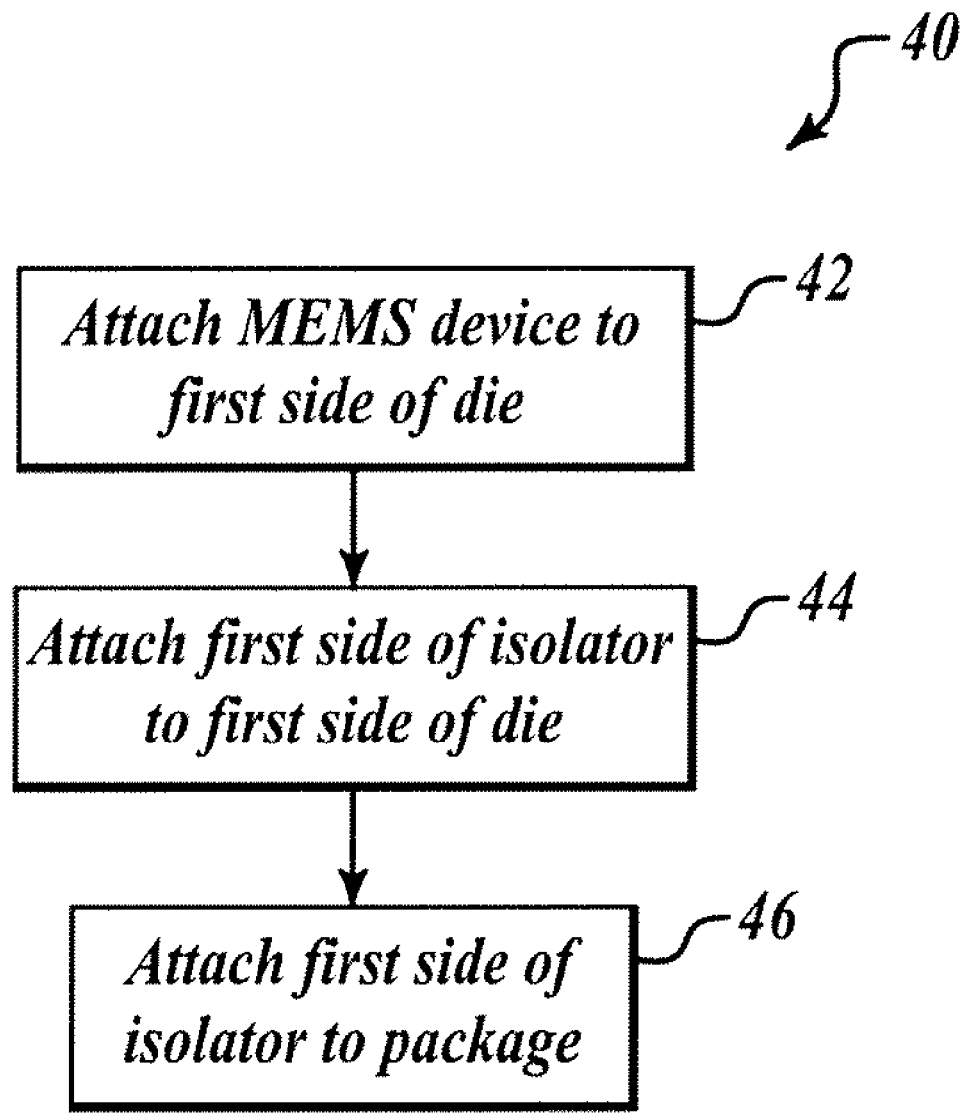
FIG. 7 illustrates a process according to an embodiment of the present invention.

FIG. 7 illustrates a process 40 according to the present invention. At a block 42, a MEMS device is attached to a first side of a die. At a block 44, a first side of an isolator is attached to the first side of the die. At a block 46, the first side of the isolator is attached to a package. The method 40 may include additional steps, such as etching isolation tines into the isolator, etching a receptacle into the isolator, and etching an angled shelf into the isolator. The method 40 may also include attaching a top cover to the die.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A device comprising:
- a microelectromechanical systems (MEMS) device;
- a die configured to support the MEMS device on a first side of the die;
- an isolator with a first side attached to the first side of the die;
- a package attached to the first side of the isolator,
- an electrically conductive attachment device configured to attach the die to the isolator and to attach the isolator to the package; and
- a top cover attached to the die, wherein the isolator further includes a receptacle formed through a thickness of the isolator, the receptacle sized and shaped to allow insertion of the top cover through the receptacle.

2. A device comprising:
- a microelectromechanical systems (MEMS) device;
- a die configured to support the MEMS device on a first side of the die;
- an isolator with a first side attached to the first side of the die, wherein the isolator includes isolation structures, and wherein the isolation structures include at least one of tines formed through a thickness of the isolator and shock stops;
- a package attached to the first side of the isolator; and
- an electrically conductive attachment device configured to attach the die to the isolator and to attach the isolator to the package.

3. A device comprising:
- a microelectromechanical systems (MEMS) device;
- a die configured to support the MEMS device on a first side of the die;
- an isolator with a first side attached to the first side of the die and an angled shelf on the first side of the isolator;
- a package attached to the first side of the isolator: and
- an electrically conductive attachment device configured to attach the die to the isolator and to attach the isolator to the package.

4. The device of claim 3 wherein when the isolator is attached to the package, a portion of the angled shelf is in contact with the package.

\* \* \* \* \*